(12) United States Patent  
Katoh

(10) Patent No.: US 7,760,539 B2  
(45) Date of Patent: Jul. 20, 2010

(54) NONVOLATILE MEMORY DEVICE

(75) Inventor: Yoshikazu Katoh, Osaka (JP)

(73) Assignee: Panasonic Corporation, Osaka (JP)

( * ) Notice: Subject to any disclaimer, the term of this patent is extended or adjusted under 35 U.S.C. 154(b) by 78 days.

(21) Appl. No.: 12/162,442

(22) PCT Filed: Jun. 14, 2007

(86) PCT No.: PCT/JP2007/062047

§ 371 (c)(1),  
(2), (4) Date: Jul. 28, 2008

(87) PCT Pub. No.: WO2007/145295

PCT Pub. Date: Dec. 21, 2007

(65) Prior Publication Data

US 2009/0046496 A1    Feb. 19, 2009

(30) Foreign Application Priority Data

Jun. 16, 2006  (JP) .............................. 2006-167579

(51) Int. Cl.  
*G11C 11/00* (2006.01)

(52) U.S. Cl. .............. 365/148; 365/185.28; 365/185.29; 365/185.18

(58) Field of Classification Search ................. 365/148, 365/185.28, 185.29, 185.18  
See application file for complete search history.

(56) References Cited

U.S. PATENT DOCUMENTS

| | | | | |
|---|---|---|---|---|
| 5,694,366 A | * | 12/1997 | Chevallier et al. ........... | 365/207 |
| 6,052,310 A | * | 4/2000 | Sunkavalli .............. | 365/185.29 |
| 6,473,332 B1 | * | 10/2002 | Ignatiev et al. .............. | 365/148 |
| 6,995,999 B2 | * | 2/2006 | Morimoto .................... | 365/148 |
| 7,145,791 B2 | | 12/2006 | Tsushima et al. | |
| 7,220,983 B2 | * | 5/2007 | Lung .............................. | 257/4 |
| 7,511,986 B2 | * | 3/2009 | Horii et al. ................... | 365/148 |
| 2004/0264244 A1 | * | 12/2004 | Morimoto .................... | 365/180 |
| 2009/0067214 A1 | * | 3/2009 | Mitani et al. ................. | 365/148 |

FOREIGN PATENT DOCUMENTS

| | | |
|---|---|---|
| JP | 2004-185756 | 7/2004 |
| JP | 2004-186553 | 7/2004 |
| JP | 2005-025914 | 1/2005 |
| JP | 2005-216387 | 8/2005 |
| JP | 2006-120701 | 5/2006 |
| WO | WO 2006/137111 A1 | 12/2006 |
| WO | WO 2007/074504 A1 | 7/2007 |
| WO | WO2007145295 A1 * | 12/2007 |

* cited by examiner

*Primary Examiner*—Viet Q Nguyen  
(74) *Attorney, Agent, or Firm*—McDermott Will & Emery LLP

(57) ABSTRACT

A variable resistance element (1) whose resistance changes with application of a voltage pulse is brought to a low resistance state by applying an erase pulse to a path shown by the broken line through selection of selection transistors. An erase pulse limiting resistance (2) is inserted in the broken-line path. The resistance value (Re) of the erase pulse limiting resistance (2) is set so that a first resistance value as the sum of all the ON resistance values of the selection transistors, Re and the wiring resistance in the path is equal to or more than a bulk resistance value of a thin film material used in the variable resistance element (1), to prevent the resistance of the variable resistance element (1) from decreasing to the bulk resistance value at which stable resistance change is not resumed.

4 Claims, 7 Drawing Sheets

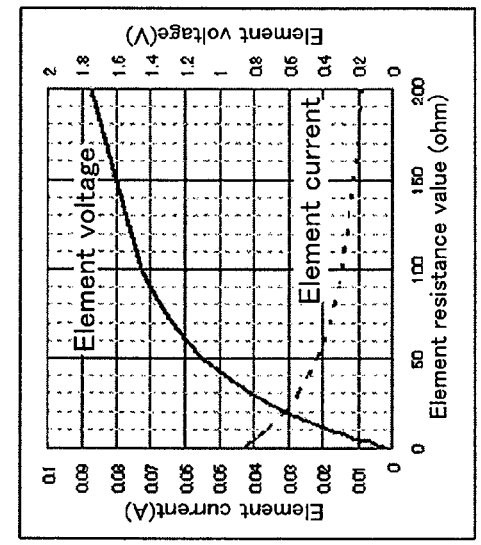
FIG.6(a) Re=0.1 Ohm
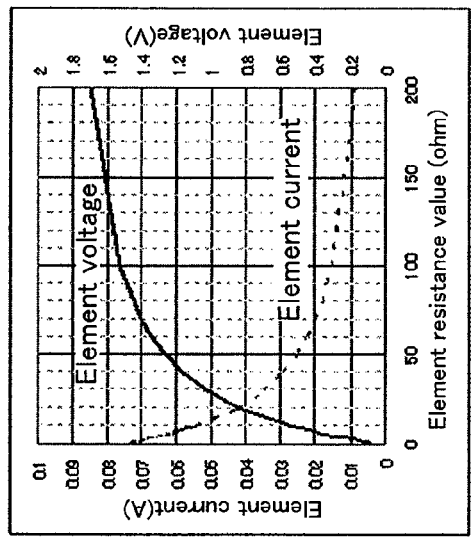
FIG.6(b) Re=25 Ohm
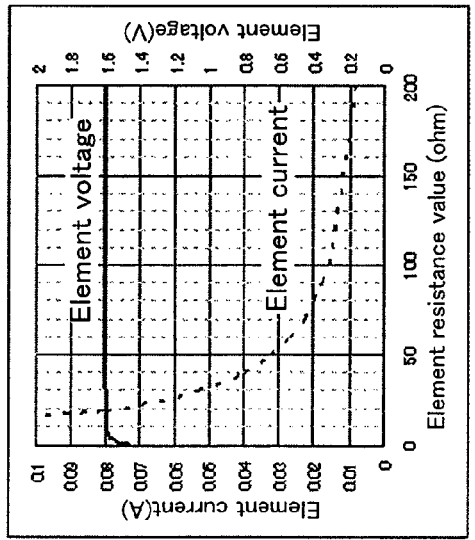
FIG.6(c) Re=50 Ohm
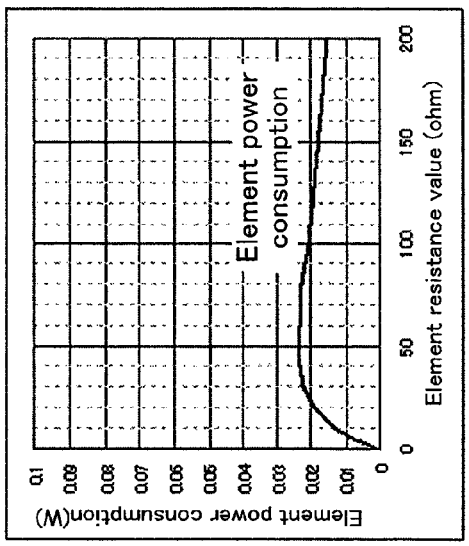
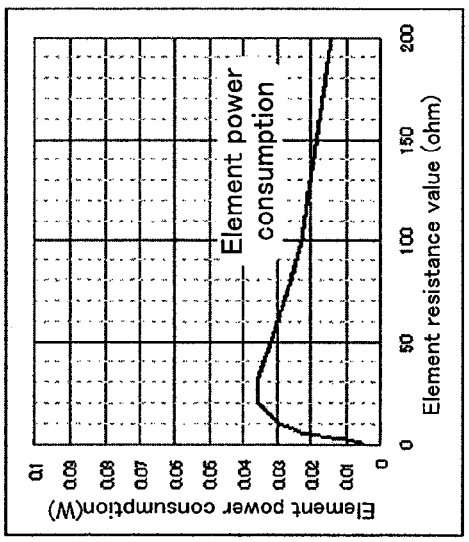
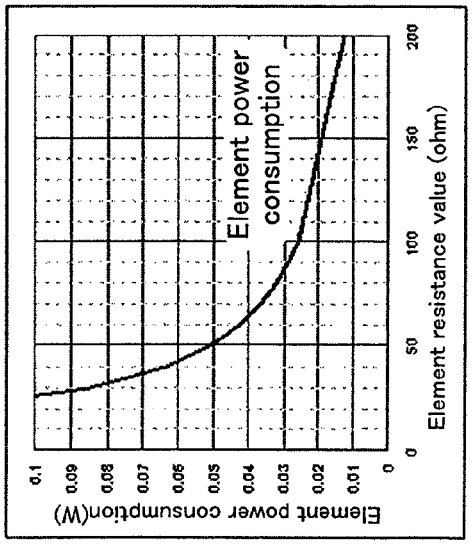

During write

During erase

During read

NONVOLATILE MEMORY DEVICE

RELATED APPLICATIONS

This application is the U.S. National Phase under 35 U.S.C. §371 of International Application No. PCT/JP2007/062047, filed on Jun. 14, 2007, which in turn claims the benefit of Japanese Application No. 2006-167579, filed on Jun. 16, 2006, the disclosures of which Applications are incorporated by reference herein.

TECHNICAL FIELD

The present invention relates to a nonvolatile memory having a memory cell permitting electrical data write/erase using a variable resistance element whose electric resistance changes, and more particularly to a nonvolatile memory device including a memory cell array having a plurality of such memory cells.

BACKGROUND ART

Nonvolatile memory devices are widely incorporated in portable equipment such as cellular phones and digital cameras, and the uses thereof have rapidly expanded. In recent years, with increase of the occasion of handling audio data and video data, nonvolatile memory devices larger in capacity and operating at higher speed than conventionally attained have come to be demanded intensely. Also, because of their uses in portable equipment, demands for lower power have been further intensified.

Under the background described above, flash memory, which controls charge accumulated at a floating gate to store data, is currently the mainstream of the nonvolatile memory devices. The flash memory, structured to accumulate charge at a floating gate in a high electric field, is so complicated in cell structure that many problems arise in attainment of higher integration. Moreover, for rewrite, it is always necessary to erase a predetermined block at a time. A very long time is therefore required for rewrite and attainment of higher speed is restricted.

As next-generation nonvolatile memory devices that solve the above problems, there are ones using variable resistance elements for recording information by way of a change in electric resistance. As nonvolatile memory devices using variable resistance elements, proposed are a magnetic RAM (MRAM), an ovonic unified memory (OUM), a resistance control nonvolatile RAM (RRAM) and the like.

An example of a control method for a RRAM element, in particular, is disclosed in Japanese Laid-Open Patent Publication No. 2004-185756 (Patent Document 1), which will be described with reference to FIG. 9.

FIGS. 9(a) to 9(c) are views showing a control method for a memory cell. In either of the views, a high-level ON voltage is being applied to the word line to put a selection transistor T1 in the ON state.

FIG. 9(a) is a view showing the voltage pulse applied state at the time of write operation. The source line is set at 0 V, and a positive write pulse having a predetermined write voltage amplitude is applied to the bit line to write desired data in a variable resistance element 1. When multi-value information is to be written in the variable resistance element 1, the voltage amplitude of the write pulse is set at the level corresponding to the number of data units to be written. For example, when 4-value data is to be written in one variable resistance element 1, one among four predetermined voltage amplitudes determined according to each write data unit is selected to perform write operation. As the write pulse width, an appropriate width corresponding to the element is selected.

FIG. 9(b) is a view showing the voltage pulse applied state at the time of erase operation. During erase, 0 V is applied to the bit line, and a positive erase pulse having an erase voltage amplitude is applied to the source line. With the application of the erase pulse, the electric resistance of the variable resistance element 1 becomes the minimum value. When 0 V is applied to a plurality of bit lines and simultaneously an erase pulse is applied to source lines for corresponding memory cells, the plurality of memory cells connected with the plurality of bit lines and the source lines are erased at a time simultaneously.

FIG. 9(c) is a view showing the voltage pulse applied state at the time of read operation. During readout of data stored in the variable resistance element 1, the source line is set at 0 V, and a predetermined read voltage is applied to a selected bit line via a read circuit. The level of the bit line is then compared with a reference level for readout by a comparison determination circuit, to thereby read stored data.

In the control method described above, ON resistance actually exists in the transistor T1. The voltage applied to the element is therefore a voltage value divided according to the ON resistance and the element resistance. In other words, in the control method in FIG. 9, provided is a drive circuit that uses the drive voltage as the voltage source and has the ON resistance of the transistor as drive impedance. In general, the ON resistance is desirably sufficiently small with respect to the element resistance. During readout of stored data, in particular, the ON resistance affects the signal quality of a read signal. This problem is disclosed in Japanese Laid-Open Patent Publication No. 2004-186553 (Patent Document 2), which describes a method for reducing ON resistance to a minimum with respect to the element resistance value while minimizing increase in memory array area.

Patent Document 1: Japanese Laid-Open Patent Publication No. 2004-185756

Patent Document 2: Japanese Laid-Open Patent Publication No. 2004-186553

DISCLOSURE OF THE INVENTION

Problems to be Solved by the Invention

However, it has been found that there is a large problem in the prior art technique of adopting the drive method described above to reduce the ON resistance to a minimum. That is, assume that a predetermined voltage pulse is applied to a variable resistance element whose resistance value changes under electrical stimulation, such as a RRAM element, in a direction of decrease of the resistance (low resistance state). In this case, if the ON resistance is small enough to be negligible with respect to the resistance value in the low resistance state of the element, the current flowing to the RRAM element is determined by the voltage value and the element resistance at the time of application of the voltage pulse. Hence, the element may fall into a corruption routine in which a large amount of current flows as the element resistance decreases, and resultant further decrease in element resistance causes flow of a further large amount of current, causing further decrease in resistance. FIGS. 3(a) and 3(b) show this phenomenon.

FIG. 3 shows current waveforms observed when a predetermined erase voltage pulse is applied to a RRAM element through a transistor emitter follower. In this drive method, the drive impedance to the element is very close to zero. FIG. 3(a)

shows a current waveform during normal operation, in which after application of a pulse, the waveform shifts from a high resistance state to a normal first low resistance state. FIG. 3(b) shows a current waveform observed when the element has fallen into a corruption routine in which the current flow becomes further sharp midway in the waveform and shifts to an abnormal second low resistance state lower than the first low resistance state. The resistance value in the second low resistance state varies with time depending on the environment of the element and the number of pulses applied. In the worst case, the element may become too abnormal to resume the first low resistance state or the high resistance state from the second low resistance state.

In view of the above problem, an object of the present invention is providing a nonvolatile memory device capable of suppressing a RRAM element from falling into a corruption routine because electric power may acceleratingly be exerted to the RRAM element when a pulse with which the RRAM element shifts to a low resistance state is applied to the element, to thereby improve the reliability of data write or erase operation for memory cells.

Means for Solving the Problems

To attain the above object, the nonvolatile memory device of the present invention includes: a variable resistance element; and power suppression means for limiting electric power applied to the variable resistance element to a predetermined value or less, wherein the variable resistance element has a structure of a resistance change film material having a sheet resistivity ($\rho$) and a film thickness (l) being sandwiched in an electrode material having an area (S), and assuming that a resistance value computed from $\rho \times l \div S$ is an element bulk resistance value ($R_{bulk}$), the variable resistance element can store information when its resistance changes under electrical stimulation within a resistance value range larger than the element bulk resistance value $R_{bulk}$, and the power suppression means suppresses electric power, consumed by the variable resistance element when an erase pulse having a pre-determined voltage amplitude (V) for changing the variable resistance element from a high resistance state to a low resistance state is applied for erasing data stored in the variable element, to a quarter or less of $V \times V \div R_{bulk}$, and applies the suppressed electric power to the variable resistance element.

With the above configuration, the electric power applied to the variable resistance element is monitored at any time, to prevent the variable resistance element from falling into the above-mentioned corruption routine at application of an erase pulse and limit the resistance value of the variable resistance element so as not to decrease to as low as the element bulk resistance value.

Alternatively, the nonvolatile memory device of the present invention has a memory cell including a variable resistance element capable of storing information with change in electric resistance, selection switch elements having predetermined ON resistance for selecting the variable resistance element and an erase pulse limiting fixed resistance element of 0Ω or more for suppressing a voltage/current flowing to the variable resistance element, all connected in series, the nonvolatile memory device also including erase pulse drive means for applying to the memory cell an erase pulse having a predetermined voltage amplitude that erases stored data by changing the variable resistance element from a high resistance state to a low resistance state, wherein, assuming that the sum of the ON resistance of all the selection transistors, wiring resistance and a resistance value of the erase pulse limiting resistance element in a path is a first resistance value, the resistance value of the erase pulse limiting resistance element is determined so that the first resistance value is equal to or more than the element bulk resistance value ($R_{bulk}$).

With the above featured configuration, the voltage actually applied to the variable resistance element is a voltage divided according to the first resistance value and the resistance value of the variable resistance element. At the element bulk resistance value $R_{bulk}$, the voltage across both ends is limited to a half or less of the erase voltage pulse, and the electric power is limited to a quarter or less of that obtained when the first resistance value is 0. Hence, the variable resistance element is suppressed from falling into the above-mentioned corruption routine at application of an erase pulse, preventing the resistance value thereof from decreasing to as low as the element bulk resistance value. Also, the inventive nonvolatile memory device can be simply configured with a combination of the transistor ON resistance and the wiring resistance. Therefore, integration of the inventive device can be implemented by an extremely easy process. Since this requires no special additional circuit, the memory capacity will not be lowered.

Alternatively, the nonvolatile memory device of the present invention has memory cells each including a variable resistance element capable of storing information with change in electric resistance and selection switch elements having predetermined ON resistance for selecting the variable resistance element, the nonvolatile memory device also including erase pulse drive means for applying to the memory cell an erase pulse having a predetermined voltage amplitude that erases stored data by changing the variable resistance element from a high resistance state to a low resistance state, wherein a terminal via which the erase pulse is applied to the memory cells is shared by all the memory cells, one end of an erase pulse limiting fixed resistance element of 0Ω or more for suppressing a voltage/current flowing to the variable resistance element is connected to the shared terminal, the other end of the erase pulse limiting fixed resistance element is connected to an output of the erase pulse drive means, and assuming that the sum of the ON resistance of all the selection transistors, wiring resistance and a resistance value of the erase pulse limiting fixed resistance element in a path is a first resistance value, the resistance value of the erase pulse limiting resistance element is determined so that the first resistance value is equal to or more than the element bulk resistance value ($R_{bulk}$).

With the above featured configuration, only one erase pulse limiting fixed resistance element is necessary for all the memory cells. Therefore, when the inventive device is made finer by a semiconductor process, a smaller-size or larger-capacity memory device can be attained.

Alternatively, the nonvolatile memory device of the present invention has memory cells each including a variable resistance element capable of storing information with change in electric resistance and selection switch elements having predetermined ON resistance for selecting the variable resistance element, the nonvolatile memory device also including erase pulse drive means for applying to the memory cell an erase pulse having a predetermined voltage amplitude that erases stored data by changing the variable resistance element from a high resistance state to a low resistance state, wherein a terminal via which the erase pulse is applied to the memory cells is shared by all the memory cells, one end of an erase pulse limiting variable resistance element of 0Ω or more for suppressing a voltage/current flowing to the variable resistance element is connected to the shared terminal, the other end of the erase pulse limiting variable resistance element is connected to an output of the erase pulse drive means, and assuming that the sum of the ON resistance of all the selection transistors, wiring resistance and a resistance value of the erase pulse limiting variable resistance element in a path is a first resistance value, the resistance value of the erase pulse limiting variable resistance element is optimally adjusted/set so as to absorb variations in first resistance value with areas that may occur due to the wiring length varying with the position of a memory cell to be erased, to thereby ensure that the first resistance value is equal to or more than the element bulk resistance value ($R_{bulk}$) for all the memory elements.

With the above featured configuration, variations in first resistance value that may be significant in a submicron, large-capacity memory array can be absorbed, and thus an erase pulse appropriate for each cell can be applied for all cells.

Effect of the Invention

As described above, according to the present invention, by providing the erase pulse limiting fixed resistance element and the erase pulse limiting variable resistance element, it is possible to suppress occurrence of a corruptive routine in which, in applying a predetermined voltage pulse to a variable resistance element (e.g., a RRAM element) whose resistance value changes under electrical stimulation in a direction of decrease of the resistance (low resistance state), in particular, a large amount of current may flow as the element resistance decreases, and resultant further decrease in element resistance may cause flow of a large amount of current, causing further decrease in resistance. Hence, a nonvolatile memory device with extremely high reliability that maintains stable resistance change can be provided.

BRIEF DESCRIPTION OF THE DRAWINGS

FIG. 6 shows views illustrating effects of an erase pulse limiting fixed resistance according to the present invention.

DESCRIPTION OF REFERENCE NUMERALS

Figure 1A:
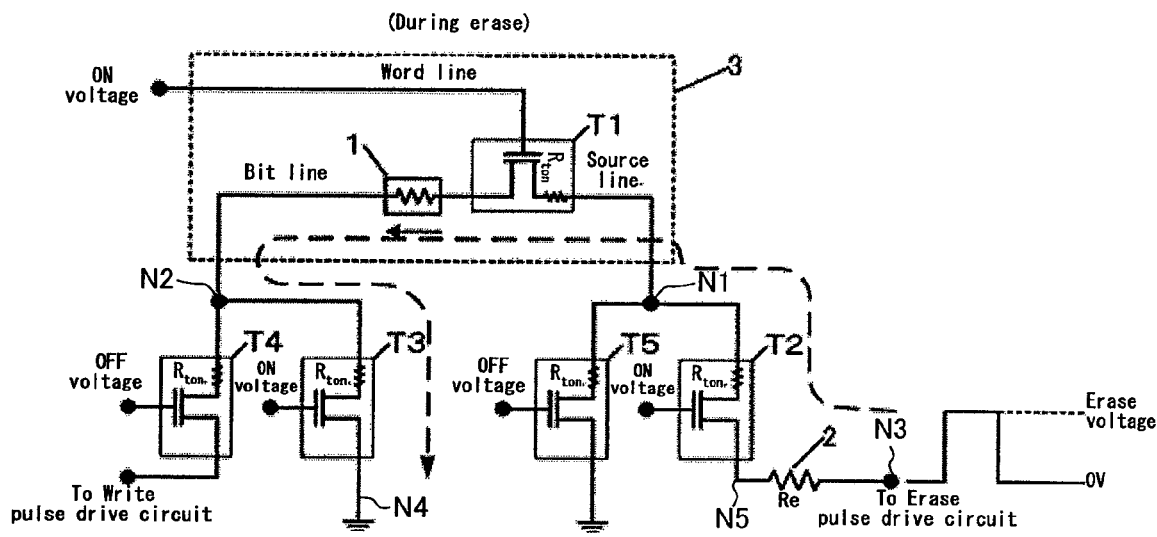
FIG. 1(a) is a view showing a memory cell configuration at the time of erase in Embodiment 1 of the present invention.

1 Variable resistance element
2 Erase pulse limiting fixed resistance
3 Memory cell
4 Memory array
5 Communication bus
6 Interface/system controller
7 Row decoder
8 Word line driver
9 Multi-switch
10 Resistance change pulse driver
11 Erase pulse drive circuit
12 Write pulse driver circuit
13 Read comparison decision circuit
14 Column address decoder/switch controller
16 Erase pulse limiting variable resistance

BEST MODE FOR CARRYING OUT THE INVENTION

Embodiments of nonvolatile memory cells and nonvolatile memory devices (hereinafter, also called "inventive devices" as appropriate) will be described with reference to the relevant drawings.

Embodiment 1

FIG. 1 shows a configuration of a memory cell of an inventive device together with configurations of drive circuits in the states of applying an erase pulse and a write pulse to the memory cell. Note that the erase pulse as used herein is defined as a pulse that changes a variable resistance element from high resistance to low resistance, in which the pulse width and the voltage amplitude are predetermined values. Note also that the write pulse as used herein is defined as a pulse that, in reverse to the erase pulse, changes a variable resistance element from low resistance to high resistance, in which, similarly to the above, the pulse width and the voltage amplitude are predetermined values corresponding to the element.

Figure 1B:
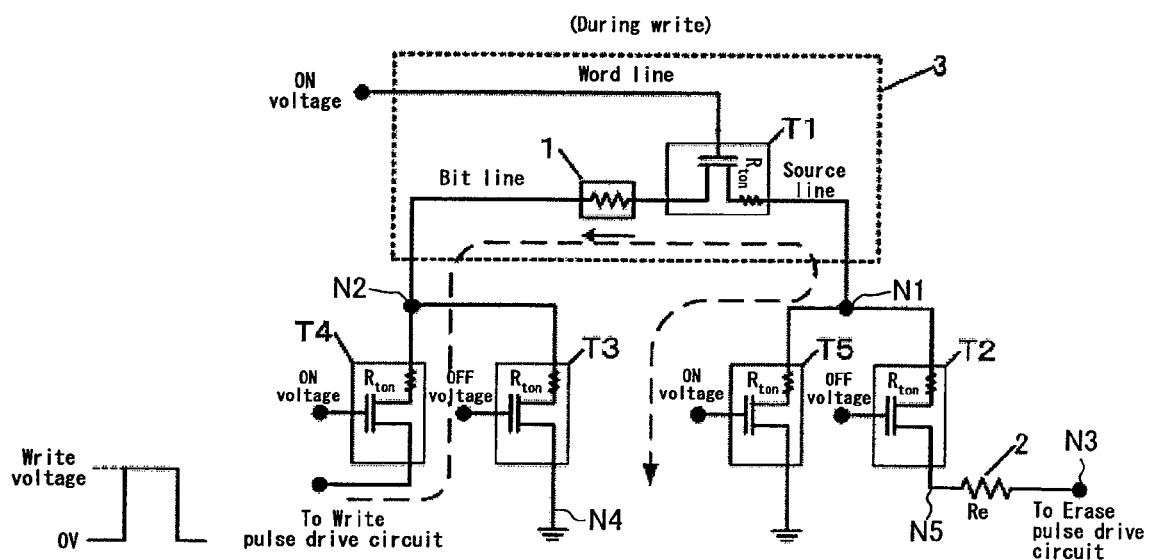
FIG. 1(b) is a view showing a memory cell configuration at the time of write in Embodiment 1 of the present invention.

As shown in FIGS. 1(a) and 1(b), the nonvolatile memory device of this embodiment includes a memory cell 3, selection transistors T2 to T5 and an erase pulse limiting fixed resistance 2.

The memory cell 3 includes a variable resistance element 1 and a selection transistor T1. The variable resistance element 1 is an element for storing data, and a RRAM element is used in this embodiment. The RRAM element is a nonvolatile memory element capable of storing data using its nature that the resistance value thereof changes with application of an electrical stress and the changed resistance value is held even after release of the electrical stress. For example, the RRAM element is composed of a thin film material of an oxide having a spinel structure such as $CoFe_2O_4$, $Co_xMn_{3-x}O_4$, $(Co_{1-x}Zn_x)FeO_4$, $(Ni_{1-x}Zn_x)Fe_2O_4$, $NiCr_2O_4$, $Cu_{0.15}Ni_{0.85}Cr_2O_4$, $MnMn_2O_4$, $ZnMn_2O_4$, $ZnV_2O_4$, $Fe_3O_4$, $AlV_2O_4$, $ZnCr_2O_4$, $ZnFe_2O_4$, and $ZnGa_2O_4$ and a thin film material of an oxide having a perovskite structure sandwiched in a predetermined electrode material.

The selection transistors T1 to T5 are respectively composed of a MOSFET, in which ON resistance is shown as $R_{ton}$ for the purpose of illustration. FIG. 1(a) shows the state of the cell at the time of erase. The transistors are selected as follows: ON voltage is applied to the gates of the transistor T1 as the first selection switch element and the transistors T2 and T3 as the second selection switch elements, and OFF voltage is applied to the gates of the transistors T4 and T5, to thereby allow a current to flow along a path shown by the broken line in FIG. 1(a). That is, a current flows via a third node N3 for connecting an erase pulse drive circuit and the erase pulse limiting fixed resistance 2, a fifth node N5 for connecting the erase pulse limiting fixed resistance 2 and the selection transistor T2, a first node N1 for connecting the selection transistor T2, T5 and the selection transistor T1, and a second node N2 for connecting the variable resistance element 1 and the selection transistor T3, T4, to the selection transistor T3 and then to a fourth node N4. FIG. 1(b) shows the state of the cell at the time of write. The transistors are selected as follows:

ON voltage is applied to the gates of the transistors T1, T4 and T5, and OFF voltage is applied to the gates of the transistors T2 and T3, to thereby allow a current to flow along a path shown by the broken line in FIG. 1(b). That is, a current flows from a write pulse drive circuit via the selection transistor T4, the second node N2 for connecting the variable resistance element 1 and the selection transistor T3, T4, the first node N1 for connecting the selection transistor T2, T5 and the selection transistor T1, and the selection transistor T5. Such a connection configuration of the selection transistors is typical as a configuration for selecting a desired memory cell in a memory array composed of a plurality of memory cells.

In this embodiment, a feature different from the conventional one is that the erase pulse limiting fixed resistance 2 having a predetermined resistance value Re for limiting the current flowing when an erase pulse is applied is inserted. The resistance value Re of the erase pulse limiting fixed resistance 2 is determined so that the resistance value $R_{all}$ as the sum of all wiring resistance values (not shown), ON resistance values of all the selection transistors and the resistance value Re of the erase pulse limiting fixed resistance 2 in the path shown by the broken line in FIG. 1(a) is equal to or more than a bulk film resistance value of the thin film material used in the variable resistance element 1.

The effectiveness of the erase pulse limiting fixed resistance 2 will be described in more detail with reference to FIGS. 2 to 5. It should be noted that evaluation data used to describe the followings was obtained using a film material having $Fe_3O_4$ as the main ingredient and containing a small amount of $Fe_2O_3$ for adjustment of the film resistance value as the film material of the variable resistance element 1. The resistivity ρ of the bulk film material in this case was computed from the sheet resistance measured previously using a film sputtered on an insulating film such as $SiO_2$, which is about 40 mΩ·cm. The actual evaluation was made using a test element for evaluation having an electrode diameter φ of 1.6 μm and a film thickness of 0.1 μm. That is, when the resistance value computed from ρ×l÷S where ρ is the resistivity, l is the film thickness and S is the electrode area is an element bulk resistance value $R_{bulk}$ of the test element for evaluation, the element bulk resistance value $R_{bulk}$ is the theoretically lowest resistance value of the element, which is about 20Ω in the example of this embodiment.

Figure 2:
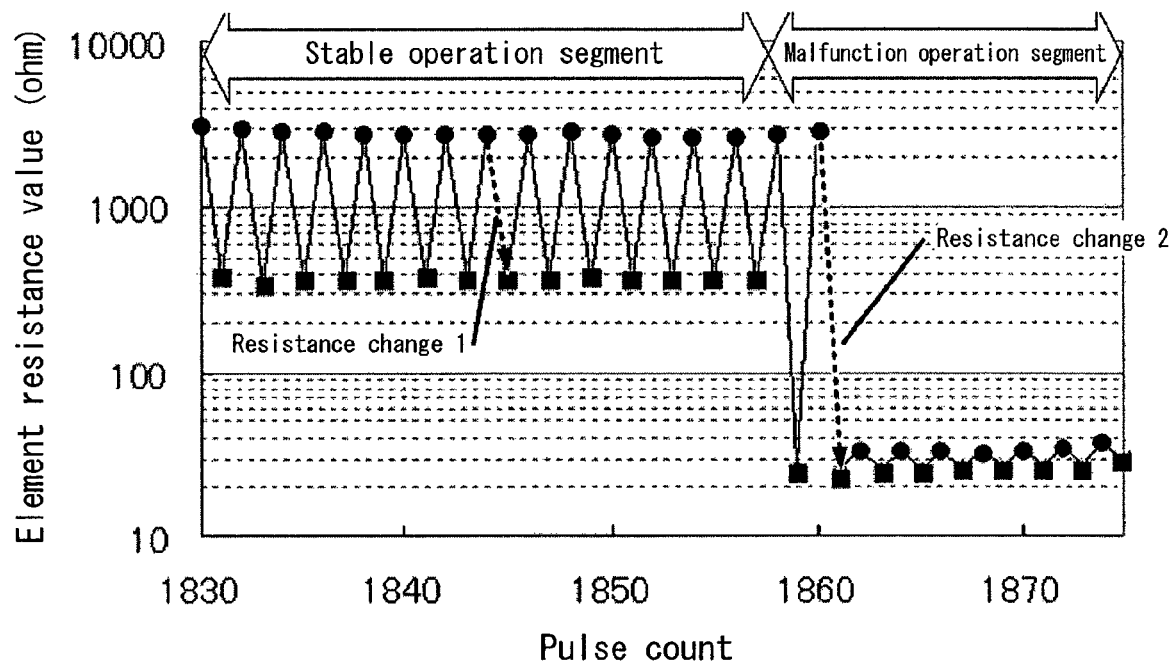
FIG. 2 shows a view illustrating a problem in a conventional memory cell.
Figure 3:
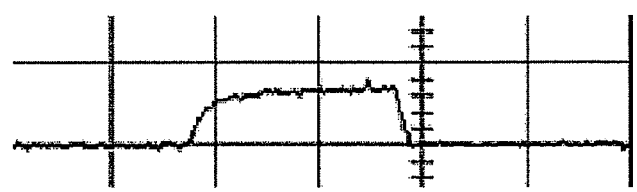
FIG. 3 shows views illustrating a problem in a conventional memory cell.
Figure 3:
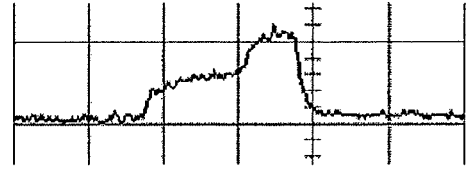

FIG. 2 shows measured data for the test element for evaluation, obtained when erase pulses and write pulses were applied alternately in a drive circuit in which the ON resistance $R_{ton}$ of the selection transistors T1 to T5 in FIG. 1 and the entire wiring resistance were small enough to be negligible and the resistance value Re of the erase pulse limiting fixed resistance 2 was zero (i.e., $R_{all}$ was zero). In FIG. 2, the circle observation points (●) represent the element resistance values after application of write pulses, and the square observation points (■) represent the element resistance values after application of erase pulses. Note that as the voltage values of the pulses, element-dependent optimum voltage values are set. In a stable operation segment in FIG. 2, stable operation is exhibited in which the resistance value of the element changes by about an order of magnitude between the write and erase pulses. However, in a malfunction operation segment, it is found that the resistance value decreases to as low as the bulk resistance value $R_{bulk}$ of about 20Ω and thereafter never resumes the desired high resistance value even though a write pulse is applied. It is therefore found that with the resistance change film material described above sandwiched in a predetermined electrode material, the resistance changes within a resistance value range higher than $R_{bulk}$, and once the element resistance decreases to as low as $R_{bulk}$, it is unable to resume the normal resistance change.

FIG. 3(a) shows a current waveform of the element at resistance change 1 in FIG. 2 observed at application of an erase pulse in the stable operation segment. FIG. 3(b) shows a current waveform of the element at resistance change 2 in FIG. 2 observed at application of an erase pulse in the malfunction operation segment. As is found from the difference between the waveforms in FIGS. 3(a) and 3(b), it is observed that in the resistance change 2 in FIG. 2, the current starts flowing acceleratingly midway in the current waveform. This is because the element has fallen into a corruption routine in which the resistance value of the element decreases with an erase pulse, the decrease in element resistance value causes further flow of current, and the further current flow causes further decrease in element resistance value. As a result, in the worst case, the resistance value decreases to as low as the bulk resistance value $R_{bulk}$ of the thin film material used in the element (20Ω as described above in this embodiment), corrupting the characteristics as the basis of the stable resistance change operation and failing to resume the original high resistance state even when a write pulse is applied.

Figure 4:
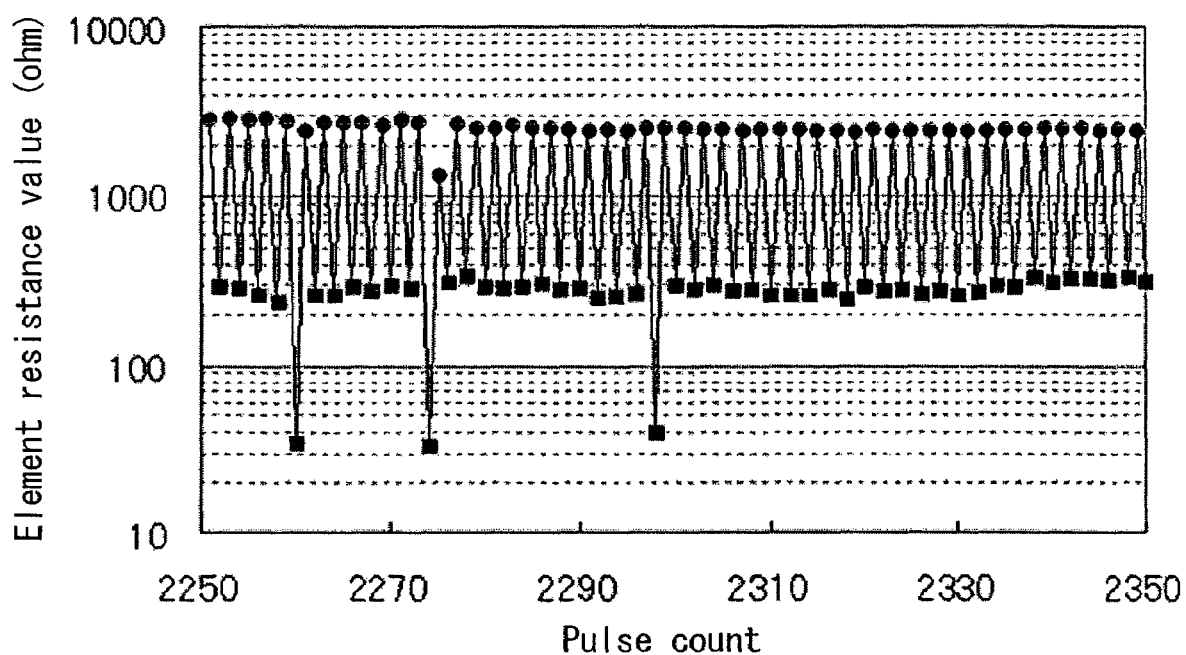
FIG. 4 shows a view illustrating an effect of improvement according to the present invention.
Figure 5:
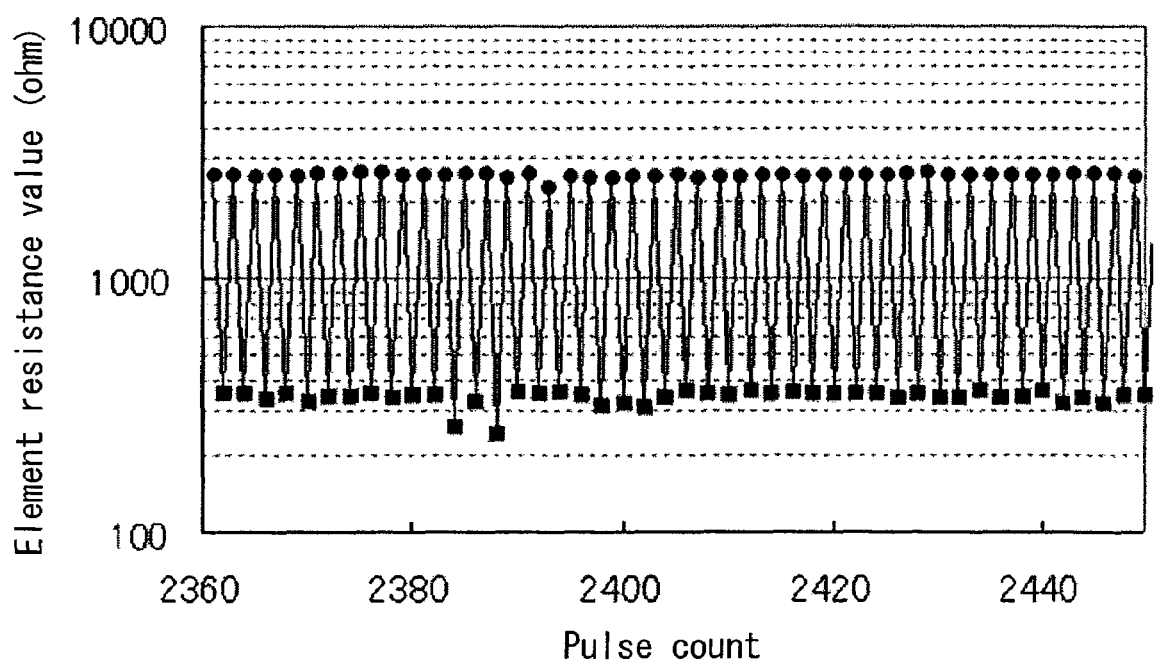
FIG. 5 shows a view illustrating an effect of improvement according to the present invention.

FIGS. 4 and 5 show the resistance changes observed when the erase and write operations are repeated alternately when the resistance value Re of the erase pulse limiting fixed resistance 2 is 25Ω ($R_{all}$=25Ω) and when Re is 50Ω ($R_{all}$=50Ω), respectively. In FIGS. 4 and 5, as in FIG. 2, the circle observation points (●) represent the element resistance values after application of write pulses, and the square observation points (■) represent the element resistance values after application of erase pulses. Assume that the ON resistance $R_{ton}$ of the transistors and the entire wiring resistance are small enough to be negligible. Thus, the voltage applied to the element is a voltage divided according to the resistance value Re of the erase pulse limiting fixed resistance 2 and the element resistance value, and it is found that as the value of Re is greater, the voltage limitation observed when the element resistance decreases is greater.

In FIG. 2 in which the resistance value Re of the erase pulse limiting fixed resistance 2 was 0Ω, the resistance value decreased to as low as the bulk resistance value $R_{bulk}$ (about 20Ω) of the thin film material used in the element due to a corruption routine as represented by the resistance change 2. This phenomenon has been improved as is apparent from FIG. 4. That is, by setting Re at 25Ω, the corruption routine described above is suppressed: the decrease in resistance value is limited to 35 to 40Ω. Further, as is found from FIG. 5, by setting Re at 50Ω, the corruption routine is completely suppressed, to exhibit stable resistance change. Although a hundred or so pulse counts were shown in FIGS. 4 and 5, this stable operation was subsequently observed at least several tens of thousands of counts.

To state the above in more detail, the relationship of the voltage/current limitation with the element resistance value observed when Re is changed will be described with reference to FIG. 6. In FIG. 6, the x-axis represents the element resistance value, the left y-axis represents the pulse current amplitude value flowing to the element, and the right y-axis represents the pulse voltage amplitude value applied to the element. FIGS. 6(a) to 6(c) show the element voltage by the solid line and the element current by the dashed line when the resistance value Re of the erase pulse limiting fixed resistance 2 is 0.1Ω, 25Ω and 50Ω, respectively. From FIGS. 4 and 5, it has been found that the resistance value of the element in the low resistance state is about 300Ω. The element voltage amplitude in the actual erase pulse application segment is 1.6 V, and the element current amplitude at this time is 10 mA at maximum. That is, it has been clarified from the element evaluation that the resistance once decreases to as low as 150Ω at the moment of application of the pulse and thereafter stabilizes at about 300Ω. Accordingly, in FIGS. 6(a) to 6(c), setting is made so that the voltage amplitude is 1.6 V when the element resistance value is 150Ω.

As is apparent from comparison among FIGS. 6(a) to 6(c), as the resistance value Re is larger, the voltage amplitude applied to the element is limited, and also the element current is limited, along with decrease in element resistance. In FIG. 6(a), it is found that since Re is roughly near zero, the voltage amplitude is not limited even when the resistance value is close to the element bulk resistance value 20Ω, resulting in flow of a current as large as 80 mA. The power consumed in the element therefore acceleratingly increases as the resistance becomes lower. In FIG. 6(b), it is found that since Re is 25Ω, the voltage amplitude is limited to about a half, i.e., 0.8 V at and around $R_{bulk}$, and along with this, the element current is also limited to a half, i.e., 40 mA. The power is therefore suppressed to a quarter or less compared with the power consumed without Re. In FIG. 6(c), since Re is 50Ω, the voltage amplitude is limited to about a third, i.e., 0.6 V or less at and around $R_{bulk}$, and along with this, the element current is also limited to about 30 mA. In this way, as the resistance value Re of the erase pulse limiting fixed resistance 2 (actually, the sum $R_{all}$ of all $R_{ton}$, the entire wiring resistance and Re in the path) is greater, the voltage amplitude applied to the element is limited due to the voltage division. Also, the current increase gradient occurring with decrease in element resistance is eased, effectively suppressing occurrence of the corruption routine described above. It has been found by experiment that the resistance will not change due to the hysteresis characteristic of the element as long as the voltage amplitude is a half or less of the voltage amplitude optimum for changing the element resistance. Accordingly, by setting the resistance value Re so that $R_{all}$ is equal to or more than the element bulk film resistance value $R_{bulk}$, the voltage amplitude is limited to a half or less at and around the resistance value $R_{bulk}$ as shown in FIG. 6(b), preventing the element resistance value from decreasing to $R_{bulk}$ and thus enabling to maintain the stable resistance change characteristic. If the film resistance largely varies due to a cause in a fabrication process, the resistance value Re should desirably be set so that $R_{all}$ is several times as large as $R_{bulk}$ for added safety.

That is, in the inventive device of this embodiment, the erase pulse limiting fixed resistance 2 is connected in series with the selected variable resistance element 1, and the resistance value Re of the erase pulse limiting fixed resistance 2 is set so that the sum $R_{all}$ of all $R_{ton}$, the entire wiring resistance and Re in the path is greater than $R_{bulk}$. With this configuration, when an erase pulse that changes the variable resistance element 1 to a low resistance state is applied, the actual voltage amplitude applied to the element is limited to a voltage value divided according to $R_{all}$ and the element resistance. Thus, the variable resistance element 1 is suppressed from falling into a corruption routine in which the resistance decreases to as low as $R_{bulk}$, and the desired resistance change characteristic can be well maintained.

The pulse voltage values, the resistance values, the erase pulse application direction and the like are not restricted to the values and configurations described in this embodiment, but can be optimally selected depending on the size and film material of the element. Although the transistor ON resistance and the wiring resistance were assumed to be small enough to be negligible for simplification of the description, such values are generally not negligible in memory devices fabricated in a semiconductor fine process but have given resistance values. Accordingly, the effect of the present invention can also be obtained by managing the resistance values in fabrication so that the sum of the ON resistance of all transistors and the wiring resistance in a path is equal to or more than the resistance value $R_{bulk}$. That is, in such a case, obviously, it is no more necessary to provide the erase pulse limiting fixed resistance 2 separately, and Re can be 0Ω.

In this embodiment, the electric power applied to the variable resistance element 1 was suppressed with a voltage divided according to the resistance values of the variable resistance element 1 and the erase pulse limiting fixed resistance 2. The present invention is not limited to this. For example, it can be easily inferred from the above description to provide a configuration in which the voltage applied to the element 1 and the current flowing into the element 1 are converted to a voltage and detected, the detected element voltage and current are converted to an electric power amount by use of a multiplier, and if the power amount is equal to or higher than a predetermined level, the application to the element 1 may be stopped.

Embodiment 2

Figure 7:
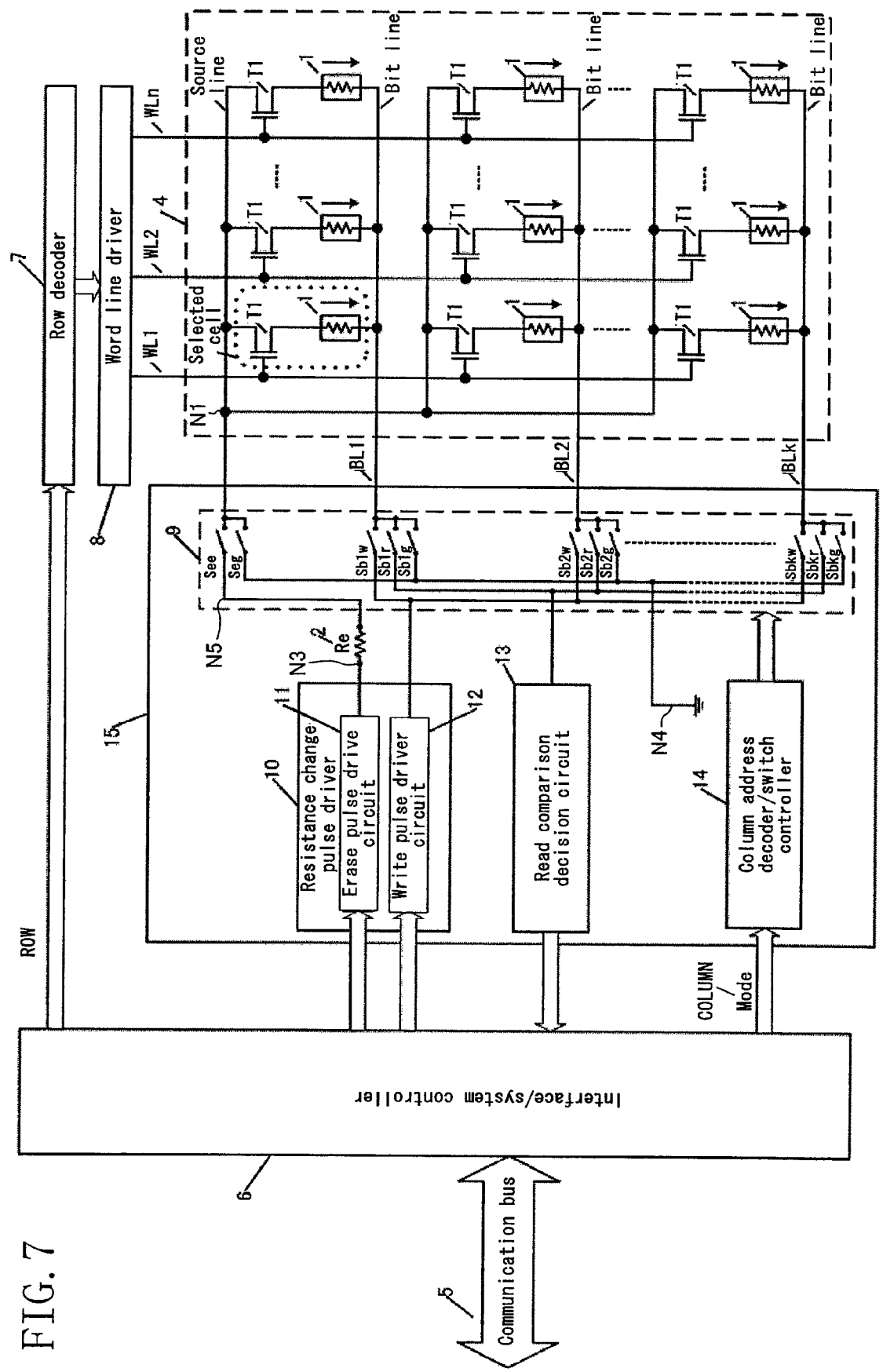
FIG. 7 is a block diagram in Embodiment 2 of the present invention.

The inventive device of Embodiment 2 will be described with reference to the relevant drawing. FIG. 7 is a block diagram of a nonvolatile memory device of this embodiment. In FIG. 7, a memory cell array 4 includes a plurality of memory cells arranged in a matrix. Each of the memory cells is the memory cell described in Embodiment 1. The same reference numerals as those in FIG. 1 are therefore the same in operation and thus description thereof is omitted here. In the memory cell array 4, the gates of transistors T1 (first selection switch elements) in each row are short-circuited (commonly connected to the corresponding word line WL1, WL2, ..., WLn). Each bit line for cells in each column is also short-circuited (terminals of variable resistance elements 1 in each column are commonly connected to the corresponding bit line BL1, BL2, ..., BLk via second nodes). Moreover, all source lines for all cells are short-circuited (terminals of transistors T1 of the cells are commonly connected to the corresponding source lines via a first node). Power supply to the inventive device and input/output of operation commands, write data and read data are performed via a communication bus 5 for external communication. An interface/system controller 6, composed of a microcomputer and the like, decodes commands and address data inputted via the communication bus 5 and controls write into memory cells. The interface/system controller 6 also controls read of data stored in memory cells in response to a request via the communication bus 5 and outputs the read data outside via the communication bus 5. A row decoder 7 decodes a row address under an instruction from the system controller 6 and outputs the row address. A word line driver 8 applies a predetermined ON voltage to a word line corresponding to the row address based on the input from the row decoder 7. Once the ON voltage is applied to the selected word line, all the transistors T1 connected to the word line are turned ON allowing access to the relevant memory cells. A column address decoder/switch controller 14 decodes a column address and the write and erase/read modes under an instruction from the system controller 6, and controls a multi-switch circuit 9 (second selection switch elements) described below according to the decoded results. The multi-switch circuit 9, composed of transistors such as FETs, selects an appropriate switch to turn ON the switch under an instruction from the column address decoder/switch controller 14. A read comparison decision circuit 13 applies a predetermined read voltage pulse to a selected memory cell, detects the current flowing at the application to read data stored in the memory cell, and outputs the resultant data to the system controller 6. An erase pulse drive circuit 11 applies an erase pulse having a predetermined voltage amplitude to a selected memory cell to change the element 1 to a low resistance state. The voltage amplitude and the pulse width are set optimally under an instruction from the system controller 6. A write pulse drive circuit 12 applies a write pulse having a predetermined voltage amplitude to a selected memory cell to change the element 1 to a high resistance state. The voltage amplitude and the pulse width are set optimally under an instruction from the system controller 6.

Hereinafter, the operation of the device in each mode will be described taking as an example the case that the cell surrounded by the dotted line in the memory cell array 4 is the selected cell. Assume that, to access the selected cell, the row decoder 7 has previously decoded the row address including the selected cell and outputted the result to the word line driver 8, and the word line driver 8 has applied a predetermined ON voltage to the word line WL1 including the selected cell to turn ON the transistors in the row including the selected cell.

First, the mode of reading data stored in the cell will be described. Under an instruction from the system controller 6, the column address decoder/switch controller 14 controls the multi-switch 9 to turn ON switches Sb1r and Seg. This permits the read comparison decision circuit 13 to be connected to the bit line BL1 for the selected cell, and the source line for the selected cell to be grounded. In this connection relationship, the read comparison decision circuit 13 applies a predetermined read pulse to the selected cell under an instruction from the system controller 6 and detects the current flowing at this time to thereby read the stored data. The read data is sent to the system controller 6 and then outputted outside the device via the communication bus 5.

The mode of writing data into the cell will then be described. Under an instruction from the system controller 6, the column address decoder/switch controller 14 controls the multi-switch 9 to turn ON switches Sb1w and Seg. This permits the write pulse drive circuit 12 to be connected to the bit line BL1 for the selected cell, and the source line for the selected cell to be grounded. In this connection relationship, the write pulse drive circuit 12 applies a write pulse having a predetermined voltage amplitude and pulse width to the selected cell under an instruction from the system controller 6 to thereby change the element resistance to a high resistance state.

The mode of erasing data in the cell will be described. Under an instruction from the system controller 6, the column address decoder/switch controller 14 controls the multi-switch 9 to turn ON switches See and Sb1g. This permits the erase pulse drive circuit 11 to be connected to the source line for the selected cell via a third node N3 for connecting the erase pulse drive circuit 11 and an erase pulse limiting fixed resistance 2 and the erase pulse limiting fixed resistance 2, and the bit line BL1 for the selected cell to be grounded (connected to a fourth node N4). In this connection relationship, the erase pulse drive circuit 11 applies an erase pulse having a predetermined voltage amplitude and pulse width to the selected cell under an instruction from the system controller 6 to thereby change the element resistance to a low resistance state.

That is, the feature of the inventive device of Embodiment 2 is that all the interconnects (source lines in the illustrated example) for applying erase pulses to the cells in the memory cell array 4 are short-circuited via the first node N1, and the erase pulse drive circuit 11 is connected to these interconnects via a fifth node N5, the erase pulse limiting fixed resistance 2 and the third node N3. Having such a configuration, only one erase pulse limiting fixed resistance 2 is necessary for all the cells, and thus the circuit scale can be minimized in integration of the inventive device in a semiconductor process.

Embodiment 3

Figure 8:
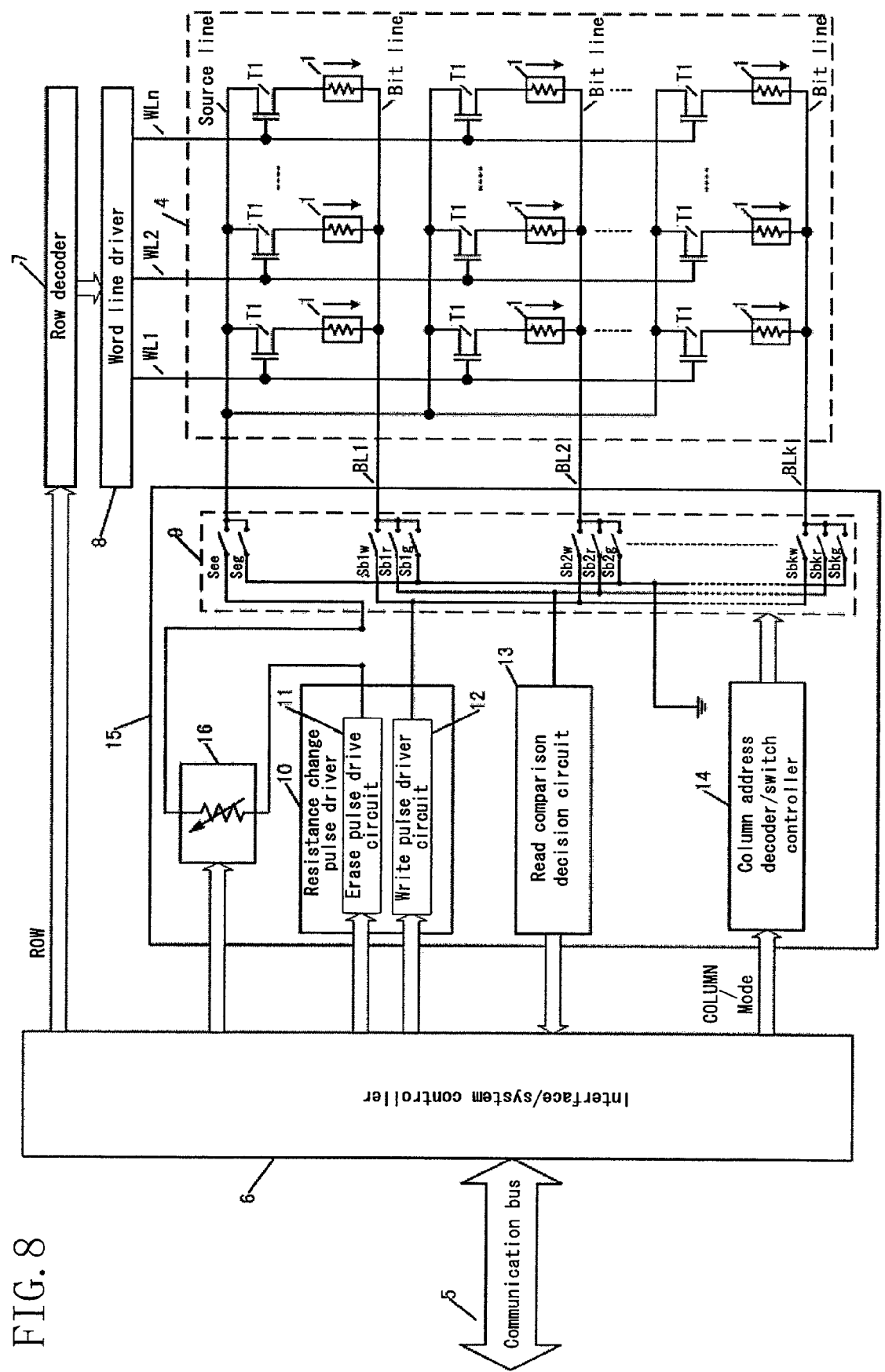
FIG. 8 is a block diagram in Embodiment 3 of the present invention.
Figure 9:
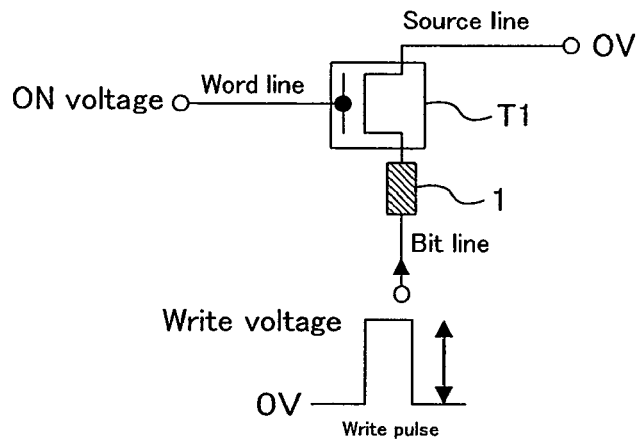
FIG. 9 shows views illustrating a conventional drive circuit.
Figure 9:
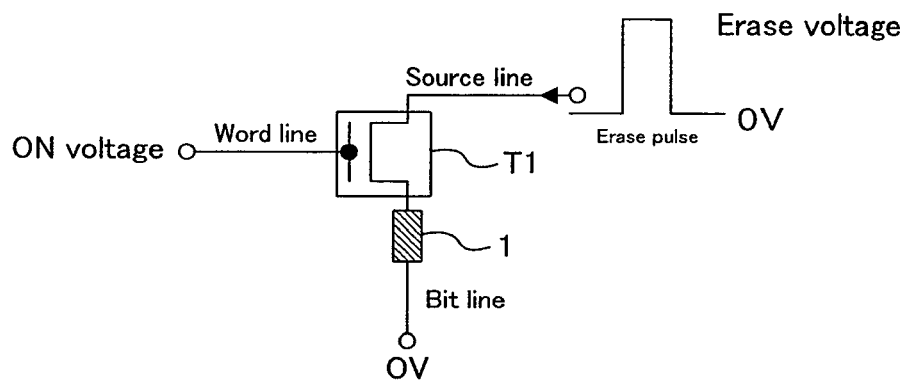
Figure 9:
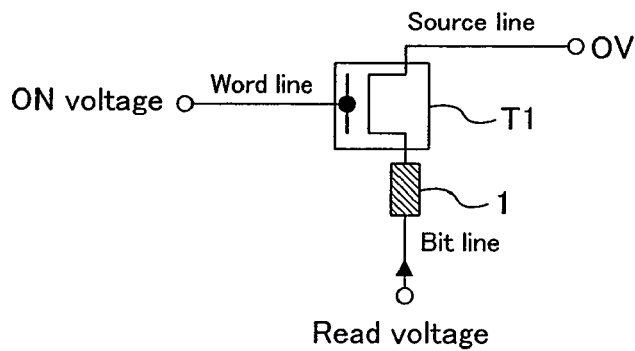

The inventive device of Embodiment 3 will be described with reference to the relevant drawing. FIG. 8 is a block diagram of a nonvolatile memory device of Embodiment 3. In FIG. 8, the same reference numerals as those in FIG. 7 are the same in function and thus description thereof is omitted here. The point different from FIG. 7 is that an erase pulse limiting variable resistance 16 is provided in place of the erase pulse limiting fixed resistance 2. The erase pulse limiting variable resistance 16 can change the resistance value in stages under an instruction from the system controller 6. The internal circuit configuration of the erase pulse limiting variable resistance 16 is not specifically shown, but can be implemented by configuring a resistance array composed of predetermined fixed resistances connected in series and selecting an appropriate number of resistances using transistor switches.

With the configuration of this embodiment, the following advantage can be obtained.

Recently, as semiconductor processes become finer and finer, the capacity of semiconductor memories is rapidly being made larger. Under such circumstances, limitation exists in reducing variations in load resistance as viewed from the driver side whatever modification is made on the number of driver circuits for applying rewrite pulses to elements, the placement thereof and the wiring paths from drivers to elements. It is therefore difficult to attain completely uniform resistance. For this reason, in the aforementioned embodiments, it is difficult to suppress electric power applied to elements equally for all the elements. If variations are large, some elements may fail to decrease to an appropriate low resistance level or may be corrupted due to insufficient suppression. This embodiment was invented in view of these problems, in which variations in wiring resistance can be adjusted for each area by use of the erase pulse limiting variable resistance 16. That is, under an instruction from the microcontroller, variations in wiring resistance occurring depending on the areas in the memory array are optimally set/adjusted in steps with the resistance values of the erase pulse limiting variable resistance 16. Thus, a nonvolatile memory device permitting stable and reliable decrease to low resistance even if having variations in the wiring length to memory cells can be provided.

INDUSTRIAL APPLICABILITY

The memory cells of the inventive device, which use variable resistance elements, can store a large capacity of information at high speed while maintaining significantly high reliability. Hence, the inventive device is usable as a card memory for portable equipment, a data storage memory for a microprocessor and the like, proving to be extremely useful as a nonvolatile memory device.

The invention claimed is:

1. A nonvolatile memory device comprising:
   a variable resistance element; and
   power suppression means for limiting electric power applied to the variable resistance element to a predetermined value or less,
   wherein the variable resistance element has a structure of a resistance change film material having a sheet resistivity (ρ) and a film thickness (l) being sandwiched in an electrode material having an area (S), and assuming that a resistance value computed from ρ×l÷S is an element bulk resistance value ($R_{bulk}$), the variable resistance element can store information when its resistance changes under electrical stimulation within a resistance value range larger than the element bulk resistance value $R_{bulk}$, and the power suppression means suppresses electric power, consumed by the variable resistance element when an erase pulse having a predetermined voltage amplitude (V) for changing the variable resistance element from a high resistance state to a low resistance state is applied for erasing data stored in the variable element, to a quarter or less of V×V÷$R_{bulk}$, and applies the suppressed electric power to the variable resistance element.

2. A nonvolatile memory device comprising a memory cell, wherein the memory cell comprises:

the variable resistance element in claim 1; and a first selection switch element having predetermined ON resistance for selecting the variable resistance element, the variable resistance element and the first selection switch element are connected in series between a first node and a second node, the nonvolatile memory device further comprises:

erase pulse drive means for applying an erase pulse having a predetermined voltage amplitude for changing the variable resistance element from a high resistance state to a low resistance state between a third node and a fourth node for erasing data stored in the variable resistance element;

an erase pulse limiting resistance element of 0Ω or more connected between the third node and a fifth node for suppressing a voltage or a current of the variable resistance element;

a wiring for connecting the first node to the fifth node and the second node to the fourth node when the erase pulse is applied to the variable resistance element; and a second selection switch element having predetermined ON resistance and provided at least one of between the first node and the fifth node and between the second node and the fourth node for changing a connection state between the first node and the fifth node or between the second node and the fourth node, and assuming that the sum of the ON resistance of the first selection switch element, the ON resistance of the second selection switch element, a resistance value of the erase pulse limiting resistance element and wiring resistance of a wiring path for application of the erase pulse to the variable resistance element is a first resistance value, the resistance value of the erase pulse limiting resistance element is determined so that the first resistance value is equal to or more than the element bulk resistance value ($R_{bulk}$).

3. The nonvolatile memory device of claim 2, wherein the nonvolatile memory device comprises a plurality of the memory cells, the first node is shared among the plurality of memory cells, and the second selection switch element selects one memory cell among the plurality of memory cells at the time of application of the erase pulse to one selected from the plurality of memory cells, and connects the second node of the selected memory cell and the fourth node and connects the common first node and the fifth node.

4. The nonvolatile memory device of claim 3, wherein the erase pulse limiting resistance element has a resistance value which is adjustable depending on the memory cell to which the erase pulse is applied among the plurality of memory cells.

* * * * *